United States Patent
Tanaka

(10) Patent No.: US 8,942,858 B2
(45) Date of Patent: Jan. 27, 2015

(54) CONTROLLING DEVICE AND METHOD

(75) Inventor: Masato Tanaka, Tokyo (JP)

(73) Assignee: Azbil Corporation, Tokyo (JP)

( * ) Notice: Subject to any disclaimer, the term of this patent is extended or adjusted under 35 U.S.C. 154(b) by 380 days.

(21) Appl. No.: 13/546,840

(22) Filed: Jul. 11, 2012

(65) Prior Publication Data
US 2013/0018488 A1 Jan. 17, 2013

(30) Foreign Application Priority Data
Jul. 11, 2011 (JP) ................................. 2011-152508

(51) Int. Cl.
G06F 19/00 (2011.01)
G05B 11/42 (2006.01)
G05D 23/19 (2006.01)
G05B 13/02 (2006.01)
H01L 21/67 (2006.01)

(52) U.S. Cl.
CPC ............ *G05B 11/42* (2013.01); *G05D 23/1919* (2013.01); *G05B 13/021* (2013.01); *H01L 21/67248* (2013.01)
USPC .......................................... 700/300; 700/52

(58) Field of Classification Search
USPC .................. 700/95, 296, 300, 295; 477/37; 701/103; 705/80; 327/309
See application file for complete search history.

(56) References Cited

U.S. PATENT DOCUMENTS

| 4,768,066 A | * | 8/1988 | Ito ................................. 355/55 |
| 5,059,880 A | * | 10/1991 | Hiroi ............................. 318/610 |
| 6,311,091 B1 | * | 10/2001 | Yamahira ........................ 700/11 |
| 6,684,113 B2 | | 1/2004 | Tanaka |

(Continued)

FOREIGN PATENT DOCUMENTS

| CN | 1447931 | 10/2003 |
| CN | 201522015 | 7/2010 |
| CN | 102385321 | 3/2012 |

(Continued)

OTHER PUBLICATIONS

Azbil Corporation, Multi Loop Control with Mulit input Computation Function, 2012, Azbil Corp., p. 1-3.*

(Continued)

*Primary Examiner* — Kidest Bahta
(74) *Attorney, Agent, or Firm* — Troutman Sanders LLP

(57) ABSTRACT

A controlling device comprises: a temperature ramp-up time estimating portion for estimating a required temperature ramp-up time for the controlled quantity in each individual control loop to reach a set point when the operating quantity output upper limit value of each individual control loop has been sent to a specified output upper limit value; a required output estimating portion for estimating, for each individual control loop, a required operating quantity output for the controlled quantity to reach the set point within the temperature ramp-up time; an output upper limit value setting portion for setting, temporarily, the operating quantity output as the operating quantity output upper limit value of the individual control loop; and a controlling portion that is provided for each individual control loop.

8 Claims, 4 Drawing Sheets

(56) References Cited

U.S. PATENT DOCUMENTS

| | | | |
|---|---|---|---|
| 6,922,594 B2 | 7/2005 | Tanaka | |
| 6,959,219 B2 * | 10/2005 | Tanaka | 700/33 |
| 2003/0216823 A1 * | 11/2003 | Tanaka | 700/67 |
| 2004/0024474 A1 | 2/2004 | Tanaka | |
| 2010/0169227 A1 * | 7/2010 | Boss et al. | 705/80 |
| 2012/0053747 A1 | 3/2012 | Tanaka et al. | |

FOREIGN PATENT DOCUMENTS

| | | |
|---|---|---|
| JP | H7-96168 A | 4/1995 |
| JP | 3798607 B2 | 7/2006 |
| KR | 2003-0022338 A | 3/2003 |

OTHER PUBLICATIONS

Chinese Office Action dated Mar. 28, 2014, from corresponding Chinese Application No. 201210236372.5.

Korean Office Action, dated Oct. 10, 2013, which issued during the prosecution of Korean Patent Application No. 10-2012-0060342, which corresponds to the present application.

\* cited by examiner

CONTROLLING DEVICE AND METHOD

CROSS REFERENCE TO RELATED APPLICATIONS

The present application claims priority under 35 U.S.C. §119 to Japanese Patent Application No. 2011-152508, filed Jul. 11, 2011, which is incorporated herein by reference.

FIELD OF INVENTION

The present invention relates to a controlling device and controlling method for a multi-loop control system provided with a plurality of control loops, and, in particular, relates to a technology for controlling so that the times for reaching set points after controlled quantities in individual control loops are changed at the time of updating set points will be essentially identical.

BACKGROUND

Conventionally, as one example of a heating device that is provided with multiple control loops, there have been the oxidizing/diffusing furnaces as illustrated in FIG. 5. Silicon wafers 105 are loaded into the inside of a quartz tube 104 within an oxidizing/diffusing furnace 100. Temperature sensors 102-1 through 102-3 measure the temperatures PV at control zones Z1 through Z3 that are heated by respective heaters 103-1 through 103-3. Regulators 101-1 through 101-3 calculate operating quantities MV that will cause the respective temperatures PV, measured by the temperature sensors 102-1 through 102-3, to go to the temperature set points SP, and output these operating quantities MV to the heaters 103-1 through 103-3. In this way, the oxygen and the silicon wafers 105 that have been introduced into the quartz tube 104 of the oxidizing/diffusing furnace 100 are heated to form an oxide layer on the surfaces of the silicon wafers 105. In the heating device illustrated in FIG. 5, the individual regulators 101-1 through 101-3 form three individual control loops for controlling respective temperatures PV of the control zones Z1 through Z3.

In the heating devices that are provided with multiple control loops, overshooting occurs in the control loop wherein the temperature ramps up first, due to the temperature interferences between the control loops when the temperatures ramp-up in each of the control zones simultaneously, requiring extended time until a stabilized state of control is achieved, thus causing a loss in the equipment operating efficiency.

Given this, there has been a proposal for a method for controlling the operation by ramping up the set points SP (that is, an operation wherein the set points SP are increased gradually while sequentially measuring the state of control (See Japanese Patent 3798607 ("JP '607")). In the controlling method disclosed in JP '607, the degree of progress in the step response of the first control loop, wherein the temperature ramp-up is the slowest, is calculated, and the temperatures in the other control loops, excluding the first control loop, are modified automatically to synchronize with the temperature of the first control loop, to correct the set points SP of the other control loops based on the degree of progress in the step response.

When implementing this type of controlling method, ordinary regulators, or the like, that are equipped in heating devices are usually used as-is as PID control calculating devices for calculating the operating quantities MV for the individual control loops, and usually a higher-level controller, other than the regulator, is used as SP calculating means for correcting the set points SP. Consequently, it is necessary to send the controlled quantity PV to the SP calculating means from the individual PID control calculating means continuously during the temperature ramp-up process, and necessary to send the set points SP to PID control calculating means from the SP calculating means.

In the case of the controlling method disclosed in JP '607, there is a problem in that when an error occurs in the signal transmitting function between the PID control calculating means (for example, the regulator) and the SP calculating means (for example, the higher-level controller) during the temperature ramp-up process, it is necessary to shut down the temperature ramp-up itself, which, in any event, makes it impossible to perform the planned control operation.

Note that the problem point as described above is not limited to temperature ramp-up control, but occurs similarly in, for example, temperature ramp-down control, and in pressure control.

The examples of the present invention solve problems such as set forth above, and the object thereof is to provide a controlling method and device wherein, when a set point has been changed, it is possible to perform control wherein the frequency of signal transmission between the control calculating means and other means is reduced and wherein the times at which the set points, after the controlled quantities have been changed in the individual control loops, are reached are essentially simultaneous.

SUMMARY

The controlling device according to the examples of the present invention include controlled quantity change time estimating means for estimating the time required for a change in a controlled quantity for a controlled quantity $PV_i$ of each individual control loop $L_i$ to reach a set point $SP_i$ when an operating quantity output upper limit value $OH_i$ of each control loop $L_i$ has been set to a specified output upper limit value $MO_i$ when set points $SP_i$ of a plurality of control loops $L_i$ have been changed simultaneously (where i=1 through n); required output estimating means for estimating, for each individual control loop $L_i$, a required operating quantity output MLA for the controlled quantity $PV_i$ to reach the set point $SP_i$ within the controlled quantity change time that is the same for each control loop $L_i$; output upper limit setting means for setting the operating quantity output MLA temporarily as the operating quantity output upper limit value $OH_i$ for each individual control loop $L_i$; and controlling means, provided for each individual control loop $L_i$, for calculating an operating quantity $MV_i$ through a control calculation by inputting the set point $SP_i$ and the controlled quantity $PV_i$, for performing a limiting process for limiting the operating quantity $MV_i$ so as to not exceed the operating quantity output upper limit value $OH_i$, and for outputting, to a control actuator of the corresponding control loop $L_i$, the operating quantity $MV_i$ after the limiting process.

Moreover, one structural example of the controlling device according to the present example further has upper limit value restoring means for determining that the controlled quantity change has elapsed and for output for restoring the operating quantity output upper limit value $OH_i$ for each individual control loop $L_i$ to the specified output upper limit value $MO_i$.

Moreover, in one structural example of the controlling device, the controlled quantity change time estimating means includes controlled quantity change quantity calculating means for calculating, for each control loop $L_i$, a change quantity $\Delta PV_i$ of the controlled quantity $PV_i$ accompanying a change in the set point SPi; controlled quantity change rate calculating means for calculating, for each control loop Li, a change rate THi in the controlled quantity PVi when the operating quantity MVi has been changed from the state of the current operating quantity MVi to a specified output upper limit value MOi; time calculating means for calculating, for each individual controlled loop Li, a time required for a change in the controlled quantity for the controlled quantity PVi to reach the set point SPi when the operating quantity MVi has been changed from the current state of the operating quantity MVi to the specified output upper limit value MOi, based on the change rate THi and the change quantity ΔPVi; and maximum value selecting means for selecting, as the controlled quantity change time that is shared by all of the control loops Li, the maximum value from among the controlled quantity change times for the individual control loops Li.

Moreover, in one structural example of the controlling device according to the present example, the set point SPi is a temperature setting value, the controlled quantity PVi is a temperature, the change in the set point SPi is a change in the controlled quantity PVi in the direction of increasing the temperature, and the controlled quantity change time is a temperature ramp-up time.

Moreover, the controlling method according to the examples of the present invention include a controlled quantity change time estimating step for estimating the time required for a change in a controlled quantity for a controlled quantity PVi of each individual control loop Li to reach a set point SPi when an operating quantity output upper limit value OHi of each control loop Li has been set to a specified output upper limit value MOi when set points SPi of a plurality of control loops Li have been changed simultaneously (where i=1 through n); a required output estimating step for estimating, for each individual control loop Li, a required operating quantity output MUi for the controlled quantity PVi to reach the set point SPi within the controlled quantity change time that is the same for each control loop Li; an output upper limit setting step for setting the operating quantity output MUi temporarily as the operating quantity output upper limit value OHi for each individual control loop Li; and a controlling step for calculating operating quantities MVi through control calculations upon inputting of the set points SPi and the control quantities PVi, for executing a limiting process to limit the operating quantities MVi so as to be no higher than the operating quantity output upper limit values OHi, and to output the operating quantities MVi, after the limiting process, to a control actuator of a corresponding control loop Li.

In the examples of the present invention, in principle, at the time of a change in set points SPi, there is no need to change the operating quantity output upper limit values OHi during the control accompanying the change in the set points SPi once the operating quantity output upper limit value OHi of each of the control loops Li have been set. Consequently, it is possible to reduce the frequency of signal transmission between the controlling means (for example, the regulators) and the other means (for example, the higher-level controller), thus making it possible to continue the planned control operations so that the controlled quantities PVi of the individual control loops Li will reach the post-change set points SPi essentially simultaneously even when there are errors in the signal transmission between the controlling means and the other means after the operating quantity output upper limit values OHi have been set.

DETAILED DESCRIPTION

A typical temperature ramp-up capability (for example, the temperature ramp-up rate at maximum output) is stored in advance, and the temperature ramp-up rate when constrained to an arbitrary output upper limit value (operating quantity MV output upper limit value) is estimated to calculate an output upper limit value that causes the times estimated for the completion of the temperature ramp-ups to be essentially identical for each of the control loops. Doing so makes it possible to approach the optimally-efficient method of startup by causing the temperature ramp-up completion times to be roughly the same for each of the individual control loops.

In this controlling method, in principle there is no need to change the output upper limit value during the temperature ramp-up once the output upper limit value has been determined at the time of the commencement of the temperature ramp-up. Consequently, even if an error were to occur in the signal transmission between the PID control calculating means (for example, a regulator) and the output upper limit value calculating means (for example, a higher-level controller), still it is possible to continue the control operation as planned. Note that insofar as the status is one wherein there is signal transmission for performing operations for fine adjustments on the output upper limit values, as necessary, such adjustments may be performed as appropriate.

In small regulators there are limits to the memory capacity for algorithms and the capacity for performing calculations in each control interval. Preferably the calculating sequence is one wherein first the ramp-up time at maximum output is calculated for each individual control loop, the longest ramp-up time calculated for the individual control loops is identified, and the amounts by which the output upper limit values are to be reduced for the individual control loops when the approximate ramp-up times thereof are to be set to specific times are calculated.

Note that the principal set forth above is not limited to temperature ramp-up control, but applies similarly to temperature ramp-down control as well.

Figure 1:
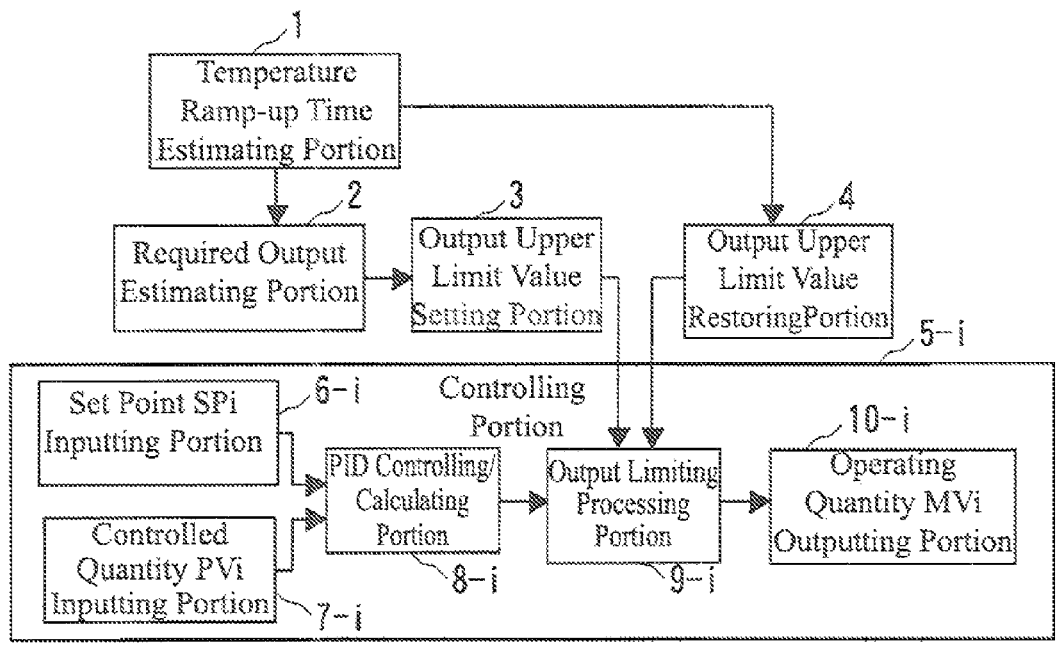
FIG. 1 is a block diagram illustrating the structure of a controlling device according to an example of the present invention.

An example according to the present invention is explained below in reference to the drawings. FIG. 1 is a block diagram illustrating the structure of a controlling device according to a form of example according to the present invention.

The controlling device according to the present example includes a temperature ramp-up time estimating portion 1 for estimating a temperature ramp-up time TL that is required in order for the controlled quantities PVi of each of the individual control loops Li to reach the set points SPi when the operating quantity output upper limit values OHi of the individual control loops Li have been set to the specified output upper limit values MOi when the set points SPi of a plurality of control loops Li have been changed simultaneously (where i=1 through n, where n is an integer greater than 1); a required output estimating portion 2 for estimating, for each control loop Li, the operating quantity output MUi required for the controlled quantity PVi to reach the set point SPi at the temperature ramp-up time TL that is shared by each of the control loops Li; an output upper limit value setting portion 3 for setting temporarily the operating quantity outputs MUi as the operating quantity output upper limit values OHi of the individual control loops Li; an output upper limit value restoring portion 4 for restoring the operating quantity output upper limit value OHi of each control loop Li to the specified output upper limit value MOi; and a controlling portion 5-$i$ that is provided for each control loop Li.

Figure 5:
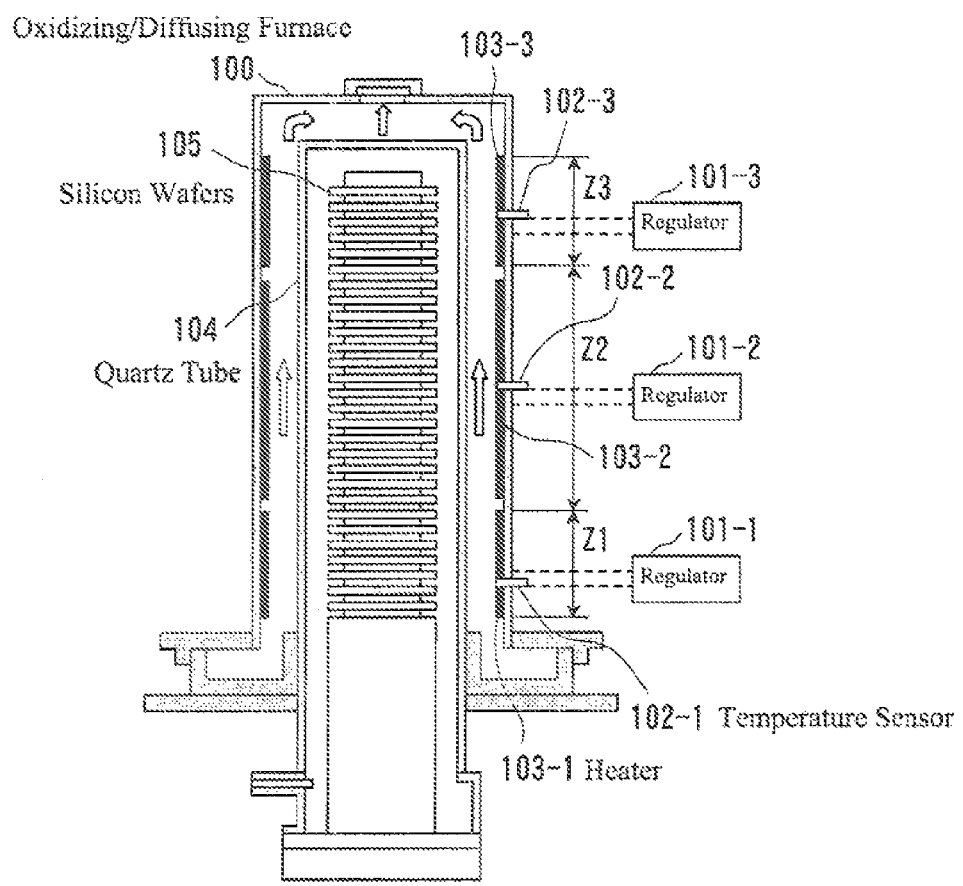
FIG. 5 is a diagram illustrating a structural example of a heating device provided with multiple control loops.

The controlling portion 5-$i$ is structured from a set point SPi inputting portion 6-$i$, a controlled quantity PVi inputting portion 7-$i$, a PID controlling/calculating portion 8-$i$, an output limiting processing portion 9-$i$, and an operating quantity MVi outputting portion 10-$i$. Note that in the present example, the explanation is for the application of the controlling device to the heating device illustrated in FIG. 5. In this case, the regulator 101-$i$ illustrated in FIG. 5 is the controlling portion 5-$i$.

Figure 2:
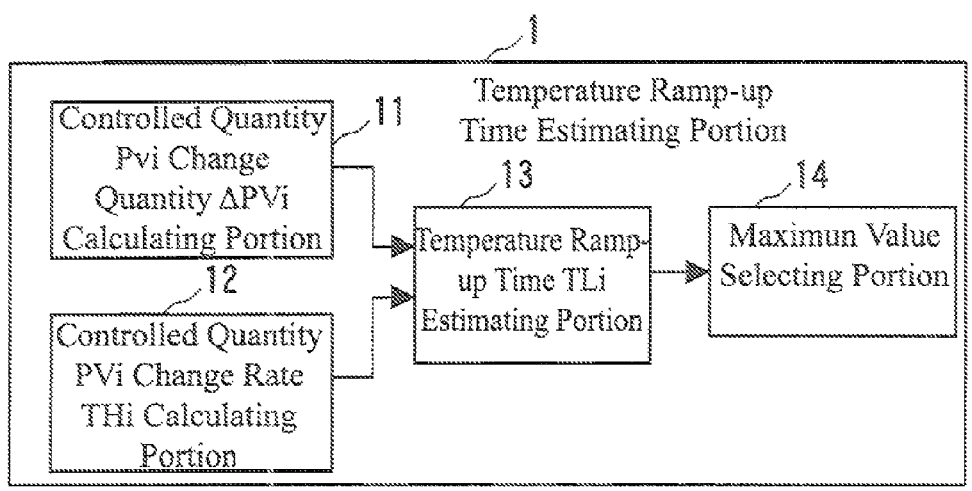
FIG. 2 is a block diagram illustrating the structure of a temperature ramp-up time estimating portion of a controlling device according to another example of the present invention.

FIG. 2 is a block diagram illustrating the structure of a temperature ramp-up time estimating portion 1 that is a the controlled quantity change time estimating means. The temperature ramp-up time estimating portion 1 is structured from a controlled quantity PVi change quantity ΔPVi calculating portion 11, a controlled quantity PVi change rate THi calculating portion 12, a ramp-up time TLi estimating portion 13 that is the time calculating means, and a maximum value selecting portion 14.

Figure 3:
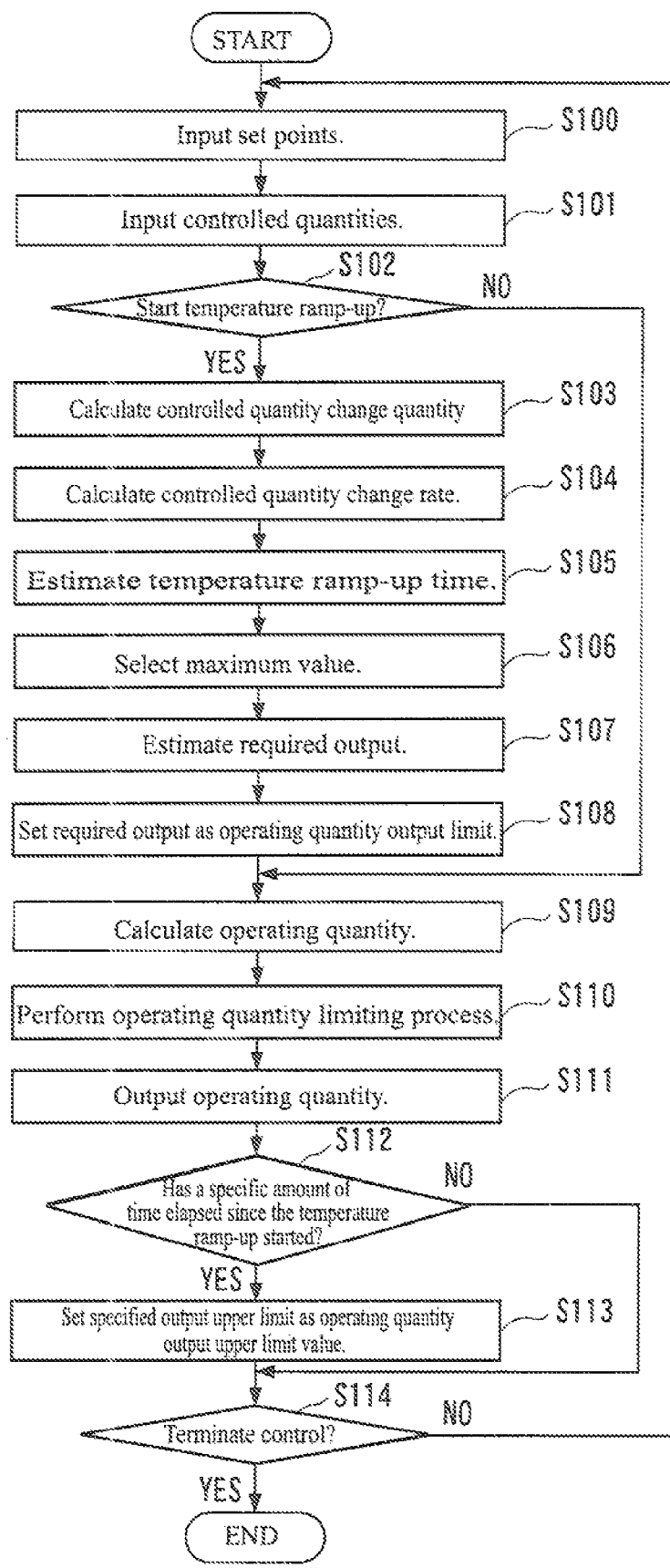
FIG. 3 is a flowchart for explaining the operation of a controlling device according to a further example of the present invention.

The operation of the controlling device is explained below. FIG. 3 is a flowchart for explaining the operation of the controlling device.

The set point SPi of each individual control loop Li (where i=1 through n) is set by an operator of the heating device, and inputted into the PID controlling/calculating portion 8-$i$ through the set point SPi inputting portion 6-$i$ (Step S100 in FIG. 3). Note that the sets point SPi are inputted into the temperature ramp-up time estimating portion 1 through the set point SPi inputting portion 6-$i$.

The controlled quantity PVi (the temperature) for each individual control loop Li is measured by a temperature sensor (a temperature sensor 102-$i$ in the example in FIG. 5) that is provided for each control loop Li, and inputted through the controlled quantity PVi inputting portion 7-$i$ into the PID controlling/calculating portion 8-$i$ (Step S101). Moreover, the controlled quantity PVi is inputted through the controlled quantity PVi inputting portion 7-$i$ into the temperature ramp-up time estimating portion 1.

Following this, if the set points SPi that are obtained from each of the controlling portions 5-$i$ have been changed simultaneously in the same direction (in this case, in the temperature ramp-up direction) (YES in Step S102), then the temperature ramp-up time estimating portion 1 estimates the temperature ramp-up time TL required in order for the controlled quantity PVi to reach the set point SPi when the operating quantity output upper limit value OHi for each individual controlling portion 5-$i$ has been set to the specified output upper limit value MOi (for example, 100%) that has been set in advance by an operator. Specifically, the temperature ramp-up time estimating portion 1 obtains the operating quantities MVi from prior to updating of the set points SPi, calculates the temperature ramp-up times TLi for the individual control loops Li for the case wherein the operating quantities MVi are set to the operating quantity output upper limit values OHi=MOi, and then selects the maximum value thereof as the temperature ramp-up time TL that is shared by all of the control loops Li.

First the controlled quantity PVi change quantity ΔPVi calculating portion 11 within the temperature ramp-up time estimating portion 1 uses the following equation to calculate, for each individual control loop Li, the change quantity ΔPVi of the controlled quantity PVi accompanying the change in the set point SPi based on the set points SPi and the controlled quantity PVi obtained from each individual controlling portion 5-$i$ (Step S103):

$$\Delta PVi = SPi - PVi \qquad (1)$$

The controlled quantity PVi change rate THi calculating portion 12 within the temperature ramp-up time estimating portion 1 obtains the current operating quantity MVi (the operating quantity MVi from prior to updating the set point SPi) from each individual controlling portion 5-$i$, to calculate, using the equation below, the change rate THi of the controlled quantity PVi when the operating quantity MVi has been changed to the maximum output MVi=MOi=100.0% (Step S104). That is, the controlled quantity PVi change rate THi calculating portion 12 calculates the change rate THi of the controlled quantity PVi by substituting into Equation (2) the controlled quantity MVi obtained from each controlling portion 5-$i$:

$$THi = THoi\{\Delta Mi/(MVOi - MVi)\} = THoi\{100.0/(100.0 - MVi)\} \qquad (2)$$

THoi is a rate of change that is known in advance for the controlled quantity PVi when the operating quantity MVi is set to the maximum output MVi=100.0% from a state wherein it was 0.0% (that is, when the operating quantity increase width ΔMi is 100.0%). Here this is applied to a heating device, and thus both THi and THoi are temperature ramp-up rates (sec./° C.). Equation (2) is a formula wherein THoi has been replaced by the operating quantity ramp-up width (MOi−MVi)=(100.0−MVi). Note that the control in accordance with the set points SPi and the controlled quantities PVi is performed in a step that comes after Step S104, and thus if the controlled quantity PVi change rate THi calculating portion 12 obtains the operating quantity MVi from each individual controlling portion 5-$i$ at the point in time of Step S104, then these operating quantities MVi will be the operating quantities from prior to the updating of the set points.

Following this, the temperature ramp-up time TLi estimating portion 13 uses the following equation to calculate, for each control loop Li, the ramp-up time TLi that would be required for the controlled quantity PVi to reach the set point SPi when the operating quantity MVi has been changed from its current state to the maximum output MVi=100.0%, based on the change rate THi and the change quantity ΔPVi of the controlled quantity PVi (Step S105).

$$TLi = THi \, \Delta PVi \qquad (3)$$

Finally, the maximum value selecting portion 14 selects, as the temperature ramp-up time TL that is shared by all of the control loops Li, the maximum value from the temperature ramp-up times TLi of the individual control loops Li (Step S106).

$$TL = \mathrm{Max}(TLI) \qquad (4).$$

The "Max ( )" in Equation (4), of course, refers to a function wherein a maximum value is selected. The processing by the temperature ramp-up time estimating portion 1 is concluded thereby.

Following this, the required output estimating portion 2 uses the following equation to calculate, for each control loop Li, the operating quantity output MUi required for the controlled quantity PVi to reach the set point SPi within the temperature ramp-up time TL, which is the same for each of the control loops Li, based on the change rate THoi, which is known in advance, the temperature ramp-up time TL, the change quantity $\Delta PVi$ of the controlled quantity PVi, and the current operating quantity PVi (Step S107).

$$MUi=\{\Delta Mi\,THoi/(TL/\Delta PVi)\}+MVi= \{100.0\,THoi/(TL/\Delta PVi)\}+MVi \quad (5)$$

Equation (5) is a formula that is obtained by substituting MUi for MOi=100.0% in the denominator in Equation (2), substituting TL/$\Delta$PVi for THi, and then solving for MUi.

The output upper limit value setting portion 3 stores the current operating quantity output upper limit value OHi=MOi, set in advance by the operator, into the output upper limit value restoring portion 4, and then sets, for each control loop Li, the operating quantity output MUi, calculated by the required output estimating portion 2, as the operating quantity output upper limit value OHi for each controlling portion 5-$i$ (Step S108). Note that the processes in Step S103 through S108 need only be performed once when the set points SPi are changed.

Following this, the PID controlling/calculating portion 8-$i$ of the controlling portion 5-$i$ calculates the operating quantities MVi through well-known PID controlling calculations based on the set points SPi inputted from the set point SPi inputting portion 6-$i$ and the controlled quantities PVi inputted from the controlled quantity PVi inputting portions 7-$i$ (Step S109).

The output limiting processing portions 9-$i$ perform the limiting processes for the operating quantities MVi as in the following equation (Step S110):

$$\text{IF } MVi>OHi \text{ THEN } MVi=OHi \quad (6)$$

That is, the output limiting processing portions 9-$i$ perform the limiting processes by setting the operating quantity MVi=OHi if the operating quantity MVi is greater than the operating quantity output upper limit value OHi.

The operating quantity MVi outputting portion 10-$i$ outputs to that which is being controlled (where the actual output destination is the heater 103-$i$ in the example in FIG. 5) the operating quantity MVi for which the limiting process has been performed by the output limiting processing portion 9-$i$ (Step S111). Because the controlling portion 5-$i$ is provided in relation to the control loop Li, the processes in Step S100, S101, and S109 through S111 are performed in each individual controlling portion 5-$i$.

Following this, when a time that is equal to A times the temperature ramp-up time TL (where A=1.5, for example) has elapsed since the beginning of the temperature ramp-up (the point in time wherein the set points SPi were changed and the operating quantity upper limit values OHi were changed from MOi to MUi) (YES in Step S112), then the specified output upper limit values MOi, set in advance by the operator, are set into each of the control loops Li as the operating quantity output upper limit values OHi for the individual controlling portions 5-$i$ (Step S113). Note that when it comes to the elapsed time that is the criterion for restoring the operating quantity output upper limit value OHi to the specified output upper limit value MOi, there is no limitation to being based on the temperature ramp-up time TL, but rather the operating quantity output upper limit value OHi may be restored to the specified output upper limit value MOi when a fixed time interval, set by the operator in advance, has elapsed.

The controlling device performs the processes in Step S100 through S113 as described above at fixed time intervals until the control is terminated by, for example, an instruction from an operator (YES in Step S114).

Figure 4:
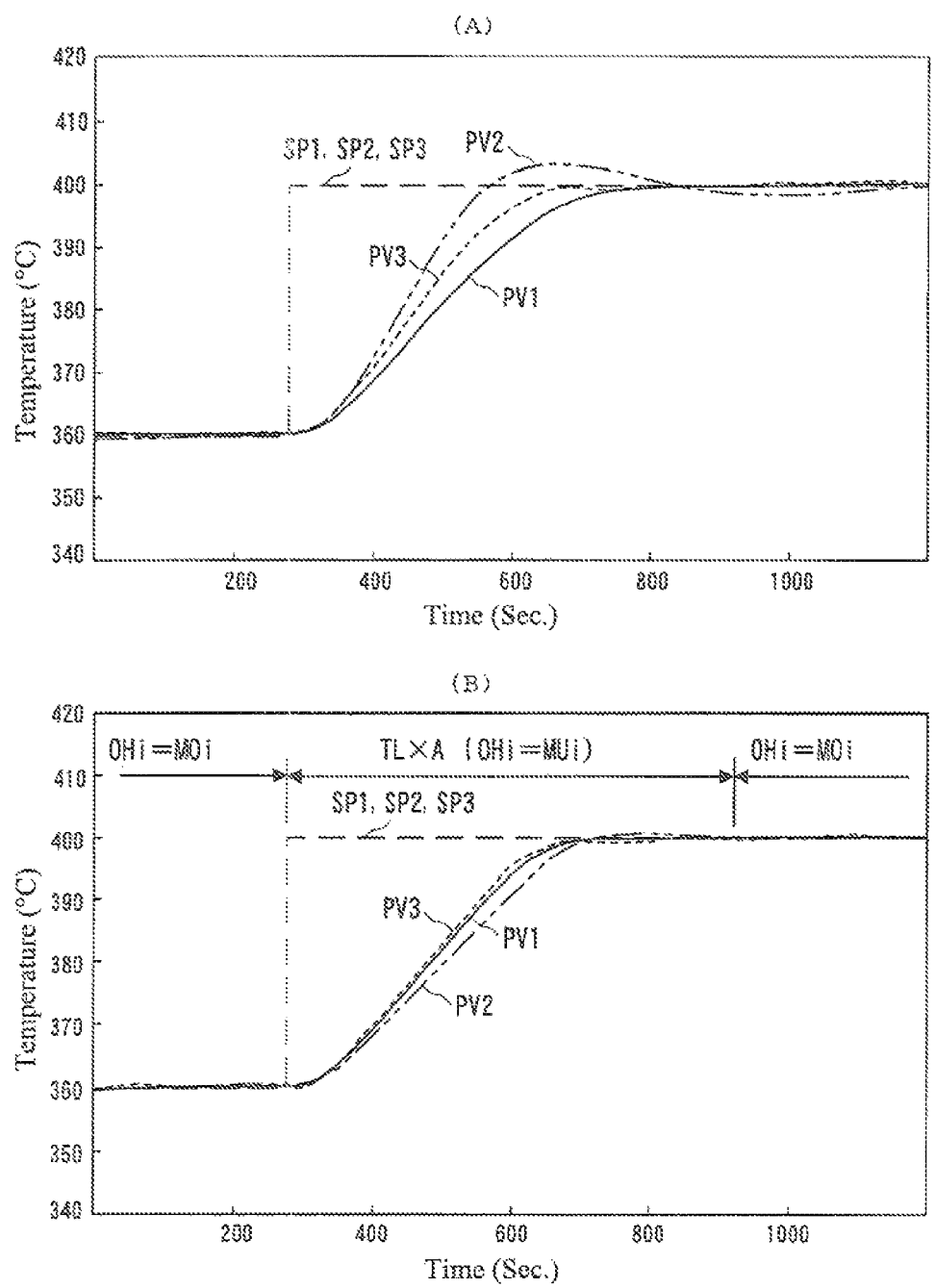
FIG. 4 is a diagram illustrating an example of operation of a conventional controlling device and an example of operation of a controlling device according to an example of the present invention.

FIG. 4 (A) shows the temperature ramp-up results when the three-zone heating controlling system illustrated in FIG. 5 was controlled by a conventional technology. Here the operating quantity output upper limit value that is set in the regulator 101-1 of the control loop L1 for controlling the temperature PV1 of the control zone Z1 was set to OHi1=MO1=100%, the operating quantity output upper limit value that is set in the regulator 101-2 of the control loop L2 for controlling the temperature PV2 of the control zone Z2 was set to OHi2=MO2=100%, and the operating quantity output upper limit value that is set in the regulator 101-3 of the control loop L3 for controlling the temperature PV3 of the control zone Z3 was set to OHi3=MO3=100%.

In this example, the temperature ramp-up was performed in a low temperature domain which is typically acknowledged as being one wherein a clean temperature ramp-up, with little overshooting, is difficult. According to FIG. 4 (A), it can be seen that the temperature PV2 in the control loop L2 was affected by a thermal interference from the control loop L3, to have a large overshoot. On the other hand, the temperature PV1 of the control loop L1 was affected by the reduced output of the heater 103-2, due to the PID control accompanying the tendency to overshoot in the control loop L2, reducing the pace of the temperature ramp-up in the final stage of the temperature ramp-up.

FIG. 4 (B) illustrates the temperature ramp-up results when the three-zone (n=3) heating controlling system illustrated in FIG. 5 was controlled by the controlling device according to the present example. Here the specified output upper limit values were set as MO1=MO2=MO3=100%, the operating quantity output upper limit value that was set in the controlling portion 5-1 (the regulator 100-1) of the control loop L1 at the start of the temperature ramp-up was set to OH1=MU1=100%, the operating quantity output upper limit value that was set in the controlling portion 5-2 (the regulator 100-2) of the control loop L2 at the start of the temperature ramp-up was set to OH2=MU2=72%, and the operating quantity output upper limit value that was set in the controlling portion 5-3 (the regulator 100-3) of the control loop L3 at the start of the temperature ramp-up was set to OH3=MU3=95%.

It can be seen in FIG. 4 (B) that the estimated times until the completion of the temperature ramp-up were controlled by the output upper limit values MU1, MU2, and MU3 so as to be essentially the same in each individual control loop. The tendency for the temperature PV2 of the control loop L2 to overshoot was suppressed through reconciling together the speeds with which the temperature ramped-up. Moreover, because the control of the control loop L2 is stable, due to the suppression of the tendency to overshoot, the temperature ramp-up pace for the temperature PV1 of the control loop L1 was also stable.

As described above, in the present example the frequency with which signals are transmitted between the controlling portions 5-$i$ (for example, regulators) and the other devices (for example, the higher-level controller) is reduced, thus making it possible to continue the control operations as planned, so as to cause the controlled quantities PVi for each of the control loops Li to reach the set values SPi, after updating, at about identical times, even if there is a failure in the signal transmission between the controlling portions 5-$i$ and the other devices after the operating quantity upper limit values OHi have been set at the time at which the temperature ramp-up was started.

Moreover, because, in the present example, the operating quantity output upper limit value OHi is changed to another constant value only temporarily, rather than changing directly the operating quantities MVi themselves, no extraneous fluctuations are produced in the operating quantities MVi. Consequently, there is no negative impact on the PID controlling calculations, making it possible to obtain a control/response waveform that is not unnatural.

Note that while in the present example the explanation used an example of a case of temperature ramp-up control, there is no limitation thereto, but rather the present invention can be applied also to temperature ramp-down control or to pressure control.

While in the present form of embodiment the controlling device was divided into two sets of devices, the controlling portions 5-*i* and the other devices (namely, the temperature ramp-up time estimating portion 1, the required output estimating portion 2, the output upper limit value setting portion 3, and the output upper limit value restoring portion 4), instead each of these devices may be embodied through a computer that is provided with a CPU, a storage device, and an interface, and a program for controlling these hardware resources. The CPU in each of the devices performs the processes explained in the present form of embodiment following a program that is stored in the storage device.

The present invention can be applied to a technology for performing control, in a multi-loop control system, so that the controlled quantities of each of the control loops, when set points have been changed, will reach the set points after updating at essentially identical times.

The invention claimed is:

1. A controlling device comprising:
    a controlled quantity change time estimating device estimating the time required for a change in a controlled quantity for a controlled quantity PVi of each individual control loop Li to reach a set point SPi when an operating quantity output upper limit value OHi of each control loop Li has been set to a specified output upper limit value MOi when set points SPi of a plurality of control loops Li have been changed simultaneously (where i=1 through n);
    a required output estimating device estimating, for each individual control loop Li, a required operating quantity output MUi for the controlled quantity PVi to reach the set point SPi within the controlled quantity change time that is the same for each control loop Li;
    an output upper limit setting device setting the operating quantity output MUi temporarily as the operating quantity output upper limit value OHi for each individual control loop Li; and
    a controller, provided for each individual control loop Li, for calculating an operating quantity MVi through a control calculation by inputting the set point SPi and the controlled quantity PVi, for performing a limiting process for limiting the operating quantity MVi so as to not exceed the operating quantity output upper limit value OHi, and for outputting, to a control actuator of the corresponding control loop Li, the operating quantity MVi after the limiting process.

2. The controlling device as set forth in claim 1, further comprising:
    an upper limit value restoring device determining that the controlled quantity change has elapsed and for output for restoring the operating quantity output upper limit value OHi for each individual control loop Li to the specified output upper limit value MOi.

3. The controlling device as set forth in claim 1, wherein: the controlled quantity change time estimating device comprises:
    a controlled quantity change quantity calculating device calculating, for each control loop Li, a change quantity ΔPVi of the controlled quantity PVi accompanying a change in the set point SPi;
    a controlled quantity change rate calculating device calculating, for each control loop Li, a change rate THi in the controlled quantity PVi when the operating quantity MVi has been changed from the state of the current operating quantity MVi to a specified output upper limit value MOi;
    a time calculating device calculating, for each individual controlled loop Li, a time required for a change in the controlled quantity for the controlled quantity PVi to reach the set point SPi when the operating quantity MVi has been changed from the current state of the operating quantity MVi to the specified output upper limit value MOi, based on the change rate THi and the change quantity ΔPVi; and
    a maximum value selecting device selecting, as the controlled quantity change time that is shared by all of the control loops Li, the maximum value from among the controlled quantity change times for the individual control loops Li.

4. The controlling device as set forth in claim 1, wherein: the set point SPi is a temperature setting value, the controlled quantity PVi is a temperature, the change in the set point SPi is a change in the controlled quantity PVi in the direction of increasing the temperature, and the controlled quantity change time is a temperature ramp-up time.

5. A controlling method comprising:
    a controlled quantity change time estimating step, performed by a controlled quantity change time estimating device, estimating the time required for a change in a controlled quantity for a controlled quantity PVi of each individual control loop Li to reach a set point SPi when an operating quantity output upper limit value OHi of each control loop Li has been set to a specified output upper limit value MOi when set points SPi of a plurality of control loops Li have been changed simultaneously (where i=1 through n);
    a required output estimating step, performed by a required output estimating device, estimating, for each individual control loop Li, a required operating quantity output MUi for the controlled quantity PVi to reach the set point SPi within the controlled quantity change time that is the same for each control loop Li;
    an output upper limit setting step, performed by an output upper limit setting device, setting the operating quantity output MUi temporarily as the operating quantity output upper limit value OHi for each individual control loop Li; and
    a controlling step, performed by a controller, calculating operating quantities MVi through control calculations upon inputting of the set points SPi and the control quantities PVi, for executing a limiting process to limit the operating quantities MVi so as to be no higher than the operating quantity output upper limit values OHi, and to output the operating quantities MVi, after the limiting process, to a control actuator of a corresponding control loop Li.

6. The controlling step as set forth in claim 5, further comprising:
    an upper limit value restoring step determining that the controlled quantity change has elapsed and for output for restoring the operating quantity output upper limit value OHi for each individual control loop Li to the specified output upper limit value MOi.

7. The controlling method as set forth in claim 5, wherein: the controlled quantity change time estimating step comprises:

a controlled quantity change quantity calculating step calculating, for each control loop Li, a change quantity $\Delta PVi$ of the controlled quantity PVi accompanying a change in the set point SPi;

a controlled quantity change rate calculating step calculating, for each control loop Li, a change rate THi in the controlled quantity PVi when the operating quantity MVi has been changed from the state of the current operating quantity MVi to a specified output upper limit value MOi;

a time calculating step calculating, for each individual controlled loop Li, a time required for a change in the controlled quantity for the controlled quantity PVi to reach the set point SPi when the operating quantity MVi has been changed from the current state of the operating quantity MVi to the specified output upper limit value MOi, based on the change rate THi and the change quantity $\Delta PVi$; and a maximum value selecting step selecting, as the controlled quantity change time that is shared by all of the control loops Li, the maximum value from among the controlled quantity change times for the individual control loops Li.

8. A controlling method as set forth in claim 5, wherein: the set point SPi is a temperature setting value, the controlled quantity PVi is a temperature, the change in the set point SPi is a change in the controlled quantity PVi in the direction of increasing the temperature, and the controlled quantity change time is a temperature ramp-up time.

* * * * *